United States Patent
Hung et al.

(10) Patent No.: US 10,600,882 B2
(45) Date of Patent: Mar. 24, 2020

(54) SEMICONDUCTOR STRUCTURE (71) Applicant: UNITED MICROELECTRONICS CORP., Hsin-Chu (TW)

(72) Inventors: Ching-Wen Hung, Tainan (TW); Chih-Sen Huang, Tainan (TW); Yi-Wei Chen, Taichung (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 118 days.

(21) Appl. No.: 14/880,275

(22) Filed: Oct. 11, 2015

(65) Prior Publication Data
US 2017/0077257 A1    Mar. 16, 2017

(30) Foreign Application Priority Data
Sep. 11, 2015    (CN) .......................... 2015 1 0577374

(51) Int. Cl.
H01L 21/70    (2006.01)
H01L 29/49    (2006.01)
H01L 29/423    (2006.01)

(52) U.S. Cl.
CPC .... *H01L 29/4966* (2013.01); *H01L 29/42376* (2013.01)

(58) Field of Classification Search
CPC ........... H01L 29/42376; H01L 29/4958; H01L 29/66515; H01L 29/66575; H01L 29/4966
USPC ....................................................... 257/407
See application file for complete search history.

(56) References Cited

U.S. PATENT DOCUMENTS

| | | | | |
|---|---|---|---|---|
| 6,054,397 A | * | 4/2000 | Teng | H01L 21/31053 438/783 |
| 6,069,083 A | * | 5/2000 | Miyashita | B24B 37/04 216/38 |
| 6,083,840 A | * | 7/2000 | Mravic | C09G 1/02 216/89 |
| 6,354,913 B1 | * | 3/2002 | Miyashita | B24B 37/0056 106/3 |
| 6,524,376 B2 | * | 2/2003 | Aoki | C09G 1/02 106/14.41 |
| 6,611,060 B1 | * | 8/2003 | Toyoda | H01L 21/31053 257/758 |
| 6,613,621 B2 | * | 9/2003 | Uh | H01L 21/76895 257/E21.443 |

(Continued)

OTHER PUBLICATIONS

Banerjee et al., "Chemical Mechanical Planarization: Historical Review and Future Direction," ECS Transactions 13 (2008) pp. 1-19.*

(Continued)

*Primary Examiner* — Jay C Kim
(74) *Attorney, Agent, or Firm* — Winston Hsu (57) ABSTRACT

A semiconductor structure is disclosed. The semiconductor structure includes a substrate, and an interlayer dielectric disposed on the substrate which has a gate structure therein. The gate structure further includes a gate electrode with a protruding portion, and a gate dielectric layer disposed between the gate electrode and the substrate. A spacer is disposed between the interlayer dielectric and the gate electrode. An insulating cap layer is disposed atop the gate electrode and encompasses the top and the sidewall of the protruding portion.

10 Claims, 6 Drawing Sheets

(56) References Cited

U.S. PATENT DOCUMENTS

| | | | |
|---|---|---|---|
| 6,734,103 B2* | 5/2004 | Katagiri | B24B 7/228 257/E21.304 |
| 6,784,472 B2* | 8/2004 | Iriyama | H01L 21/76895 257/288 |
| 6,855,267 B2* | 2/2005 | Lee | H01L 21/3212 252/79.1 |
| 6,867,138 B2* | 3/2005 | Miyashita | B24B 37/044 156/345.12 |
| 6,908,847 B2* | 6/2005 | Saito | H01L 21/28562 257/E21.171 |
| 6,933,226 B2* | 8/2005 | Lee | H01L 29/66545 257/E21.444 |
| 7,056,794 B2* | 6/2006 | Ku | H01L 21/28079 257/412 |
| 7,723,192 B2* | 5/2010 | Carter | H01L 21/28114 257/E21.444 |
| 7,875,519 B2* | 1/2011 | Rachmady | H01L 21/28079 257/E21.409 |
| 8,035,165 B2* | 10/2011 | Yeh | H01L 21/823814 257/369 |
| 8,138,038 B2* | 3/2012 | Heinrich | H01L 21/823425 257/E21.444 |
| 8,288,296 B2* | 10/2012 | Wong | H01L 21/28123 257/310 |
| 8,421,077 B2* | 4/2013 | Jain | H01L 21/76897 257/133 |
| 8,426,300 B2* | 4/2013 | Ramachandran | H01L 21/76895 438/197 |
| 8,436,404 B2* | 5/2013 | Bohr | H01L 21/76831 257/288 |
| 8,497,212 B2* | 7/2013 | Babich | H01L 21/28088 257/E21.249 |
| 8,530,317 B1* | 9/2013 | Wu | H01L 29/4232 257/314 |
| 8,585,465 B2* | 11/2013 | Groschopf | H01L 21/31053 451/36 |
| 8,623,730 B2* | 1/2014 | Fan | H01L 29/42384 438/211 |
| 8,679,909 B2* | 3/2014 | Xie | H01L 21/28 257/330 |
| 8,772,168 B2 | 7/2014 | Xie | |
| 8,835,312 B2* | 9/2014 | Kim | H01L 21/823885 438/653 |
| 8,847,333 B2* | 9/2014 | Yu | H01L 21/82380 257/410 |
| 8,896,030 B2* | 11/2014 | Mukherjee | H01L 21/82345 257/204 |
| 8,946,793 B2* | 2/2015 | Xie | H01L 21/28114 257/288 |
| 8,952,452 B2* | 2/2015 | Kang | H01L 29/78 257/346 |
| 8,975,179 B2* | 3/2015 | Tu | H01L 29/66545 257/E21.19 |
| 9,029,920 B2* | 5/2015 | Xie | H01L 21/283 257/288 |
| 9,064,814 B2* | 6/2015 | Wu | H01L 21/311 |
| 9,070,711 B2* | 6/2015 | Xie | H01L 29/66545 |
| 9,130,029 B2* | 9/2015 | Xie | H01L 21/28 |
| 9,147,680 B2* | 9/2015 | Trevino | H01L 21/82382 |
| 9,202,691 B2* | 12/2015 | Huang | H01L 29/4966 |
| 9,209,273 B1* | 12/2015 | Lin | H01L 29/4232 |
| 9,252,238 B1* | 2/2016 | Trevino | H01L 29/66545 |
| 9,269,786 B2* | 2/2016 | Chou | H01L 29/518 |
| 9,287,263 B1* | 3/2016 | Hsu | H01L 29/66545 |
| 9,324,620 B2* | 4/2016 | Lin | H01L 21/823456 |
| 9,331,072 B2* | 5/2016 | Seo | H01L 27/088 |
| 9,384,996 B2* | 7/2016 | Huang | H01L 29/66545 |
| 9,496,361 B1* | 11/2016 | Tung | H01L 29/4958 |
| 9,524,965 B2* | 12/2016 | Ho | H01L 27/088 |
| 9,583,485 B2* | 2/2017 | Chang | H01L 27/0886 |
| 9,608,110 B2* | 3/2017 | Baars | H01L 29/513 |
| 9,614,089 B2* | 4/2017 | Chang | H01L 29/7851 |
| 9,698,232 B2* | 7/2017 | Yang | H01L 29/0649 |
| 9,818,841 B2* | 11/2017 | Chang | H01L 29/66545 |
| 9,929,271 B2* | 3/2018 | Chang | H01L 21/28008 |
| 9,947,540 B2* | 4/2018 | Tsai | H01L 21/321 |
| 10,128,336 B2* | 11/2018 | Park | H01L 21/823425 |
| 10,134,861 B2* | 11/2018 | Fang | H01L 29/4966 |
| 2009/0001480 A1* | 1/2009 | Cheng | H01L 29/42368 257/387 |
| 2011/0156107 A1* | 6/2011 | Bohr | H01L 21/76831 257/288 |
| 2013/0181265 A1* | 7/2013 | Grasshoff | H01L 21/76897 257/288 |
| 2015/0041868 A1 | 2/2015 | Cheng | |
| 2015/0041905 A1* | 2/2015 | Xie | H01L 29/6656 257/369 |
| 2016/0005731 A1* | 1/2016 | Chen | H01L 27/0629 257/300 |
| 2016/0027901 A1* | 1/2016 | Park | H01L 29/4983 257/288 |

OTHER PUBLICATIONS

Kahng, "CMP Fill Synthesis: A Survey of Recent Studies," IEEE Transactions on Computer-Aided Design of Integrated Circuits and Systems 27 (2008) pp. 3-19.*

Chen et al., "Modeling of chemical mechanical polishing processes by cellular automata and finite element/matlab integration methods," Microsystem Technology 21 (2015) pp. 1879-1892.*

* cited by examiner

SEMICONDUCTOR STRUCTURE

BACKGROUND OF THE INVENTION

1. Field of the Invention

The invention generally relates to a semiconductor structure. More particularly, the invention relates to a structure with an insulating cap layer.

2. Description of the Prior Art

In the field of semiconductor manufacturing, after a transistor structure is formed, conductive contact plugs are formed to make the transistor fully functional. Source/drain contact (S/D contact) plugs connect to the source and drain region of the transistor, and gate contact plugs connect to the gate of the transistor.

With the continuous scaling down of chip size, the critical dimension (CD) and spacing of these contact plugs is becoming smaller. Conventional contact forming processes have frequently been found to cause issues such as electric shorting between the gate and an S/D contact of a transistor, as well as high contact resistivity resulting from the smaller CD and smaller landing area of the gate contact plug. Those problems may cause failure of the device.

To solve the above issues, self-aligned contact (SAC) (also known as borderless contact technology) has been developed. By disposing an insulating cap layer on the gate to act as a hard mask during the S/D contact hole etching process, the gate electrode will not be etched and exposed, and the short between the S/D contact plug and the gate electrode can thereby be prevented.

The insulating cap layer is not desirable for the gate contact plug, however, as it may cause extra difficulty for the gate contact hole etching. Therefore, there is still a need to provide an improved semiconductor structure, which not only prevents the short between the S/D contact plug and the gate, but also has lower contact resistivity.

SUMMARY OF THE INVENTION

One objective of the present invention is to provide a semiconductor structure which is able to prevent shorting between the S/D contact plug and the gate. The proposed semiconductor structure also provides a larger landing area for the gate contact plug with lower contact resistivity as a consequence.

According to one embodiment of the invention, a semiconductor structure is disclosed. The semiconductor structure includes a substrate, and an interlayer dielectric disposed on the substrate which has a gate structure therein. The gate structure further comprises a gate electrode with a protruding portion, and a gate dielectric layer disposed between the gate electrode and the substrate. A spacer is disposed between the interlayer dielectric and the gate electrode. An insulating cap layer is disposed atop the gate electrode and encompasses the top and the sidewall of the protruding portion.

According to one embodiment of the invention, the insulating cap layer is inwardly recessed and has a concave top surface.

According to one embodiment of the invention, the gate electrode further comprises a side portion adjacent to the protruding portion, wherein the insulating cap layer above the protruding portion is thinner than the insulating cap layer above the side portion.

According to another embodiment of the invention, the insulating cap layer is atop the spacer.

According to another embodiment of the invention, the semiconductor structure further comprises a contact etching stop layer (CESL) disposed between the spacer and the interlayer dielectric. The insulating cap layer is atop the contact etching stop layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized, and structural, logical, and electrical changes may be made without departing from the scope of the present invention.

The drawings showing embodiments of the apparatus are semi-diagrammatic and not to scale, and some dimensions are exaggerated in the figures for clarity of presentation. Where multiple embodiments are disclosed and described as having some features in common, like or similar features will usually be described with like reference numerals for ease of illustration and description thereof.

FIGS. 1-4 are schematic cross-sectional diagrams showing an exemplary process for fabricating a semiconductor structure with an insulating cap layer according to a preferred embodiment of the invention.

Figure 1:
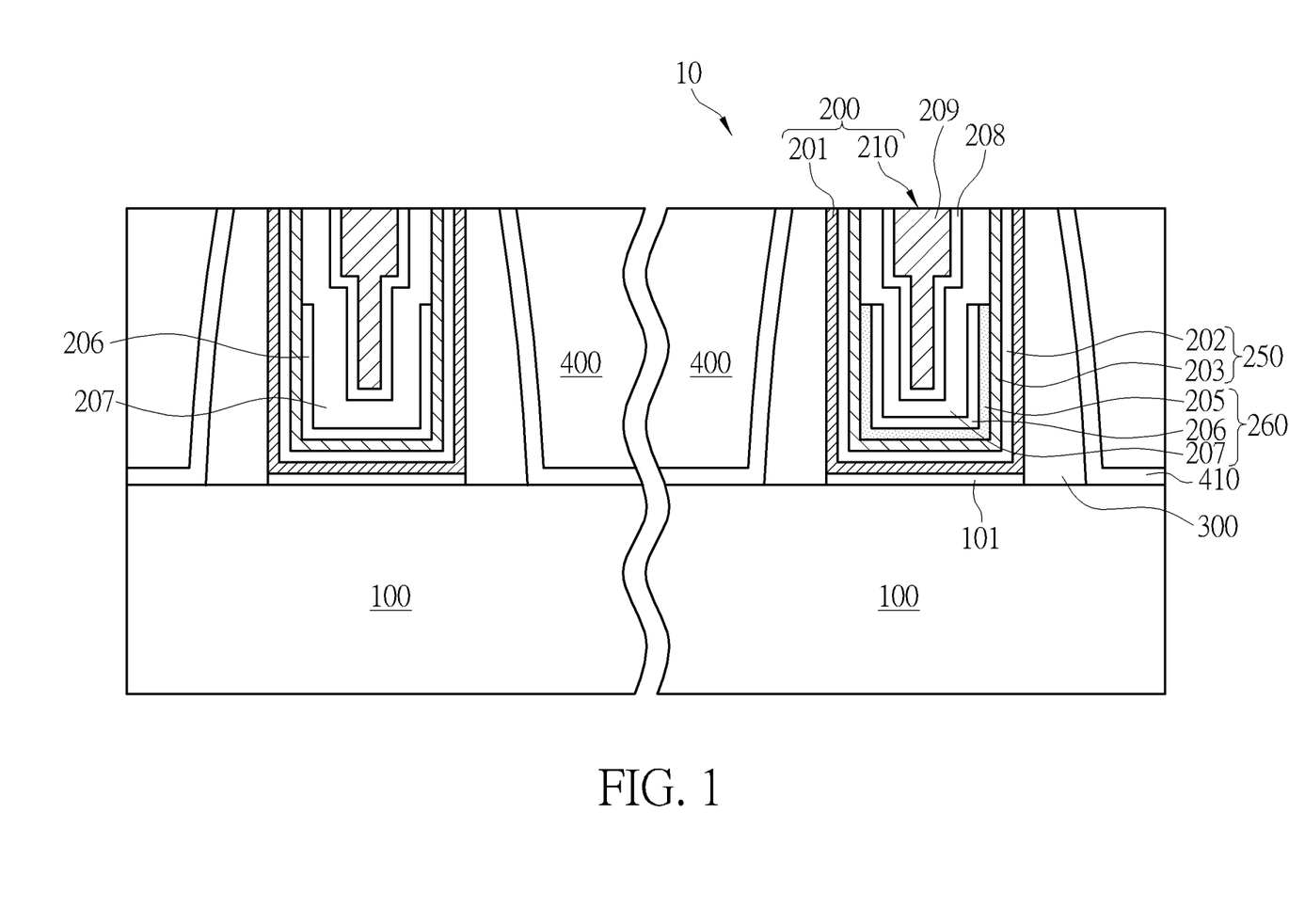
FIGS. 1-4 are schematic cross-sectional diagrams showing an exemplary process for fabricating a semiconductor structure with an insulating cap layer according to a preferred embodiment of the invention.

As shown in FIG. 1, a semiconductor structure 10 is provided. The semiconductor structures 10 may be a traditional planar transistor or an advanced non-planar transistor such as a fin field-effect-transistor (Fin-FET). The semiconductor structure 10 may be an N-type or P-type transistor, but is not limited thereto. The P-type transistor and the N-type transistor illustrated on the right side and the left side, respectively, of FIG. 1 are for illustrative purposes. Other structural, logical, and electrical changes may be made without departing from the scope of the present invention.

The semiconductor structure 10 comprises a substrate 100, such as silicon substrate, silicon containing substrate or silicon-on-insulator (SOI). A plurality of isolation structures (not shown) may be disposed in the substrate to provide electrical isolation between devices. An interlayer dielectric 400 is disposed on the substrate 100 and comprises a gate structure 200 therein. The gate structure 200 may comprise a gate electrode 210 and a gate dielectric layer 201. Preferably, the gate electrode 210 comprises metal. The gate dielectric layer 201 may comprise high-k dielectric material, such as silicon nitride (SIN), silicon oxy-nitride (SION), metal oxide such hafnium oxide (HfO2), hafnium silicon oxide, (HfSiO), hafnium silicon oxynitride (HfSiON), aluminum oxide (Al2O3), lanthanum oxide (La2O3), lanthanum aluminum oxide (LaAlO3), tantalum oxide (Ta2O5), zirconium oxide (ZrO2), zirconium silicon oxide (ZrSiO4), or hafnium zirconium oxide (HfZrO3), but is not limited thereto. Optionally, an interfacial layer 101 may be disposed between the substrate 100 and the gate dielectric layer 201.

Metal gate structures may be formed by well-known gate processes. According to different methodologies, the gate process may comprise a gate-first or gate-last process, wherein the gate-last process further comprises a high-k first or high-k last process. The gate structure 200 of the preferred embodiment as shown in FIG. 1 is formed by a gate last/high-k first process. This invention may be applied to other gate structures formed by different gate processes.

As shown in FIG. 1, the gate electrode 210 may comprise a bottom barrier metal (BBM) 250, a work function metal (WFM) 260 disposed on the BBM 250, a top barrier metal (TBM) 208 disposed on the WFM 260, and a low resistance metal (LRM) 209 filling the spaces in the middle of the gate electrode 210. The BBM 250 may comprise titanium (Ti), tantalum (Ta), titanium nitride (TiN), tantalum nitride (TaN), or the combination thereof, and may be single or multi-layer. In the preferred embodiment, the BBM 250 comprises a first bottom barrier metal 202 made of TiN, and a second bottom barrier metal 203 made of TaN. The WFM 260 may comprise TiN, TaN, TiC, TaC, WC, TiAlN, TiAl, ZrAl, WAl, TaAl, or HfAl. The WFM 260 may be single or multi-layer, and the layer stacks of the WFM 260 of different devices may be different according to specific requirements. In the preferred embodiment, the WFM 260 of the P-type transistor comprises a first work function metal 205, a second work function metal 206, and a third work function metal 207. The WFM 260 of the N-type transistor comprises the second work function metal 206, and the third work function metal 207. The TBM 208 may comprise titanium (Ti), tantalum (Ta), titanium nitride (TiN), tantalum nitride (TaN), or the combination thereof, and may be single or multi-layer. In the preferred embodiment, the TBM 208 is a single layer of TiN. The LRM 209 may comprise tungsten (W) or other suitable materials such as Al, Ti, Ta, Nb, Mo, Cu, TiN, TiC, TaN, Ti/W, or Ti/TiN, but is not limited thereto.

It should be understood that, although this feature is not shown in the figures, the semiconductor structure 10 may further comprise lightly doped drain regions (LDD) and source/drain (S/D) regions adjacent to the gate structure 200. In the preferred embodiment, the gate dielectric layer 201, the BBM 250, the WFM 260 and the TBM 208 have a U-shaped cross-section. The gate dielectric layer 201 may also have a line shaped cross-section when the gate structure is formed by different processes, however.

Figure 2:
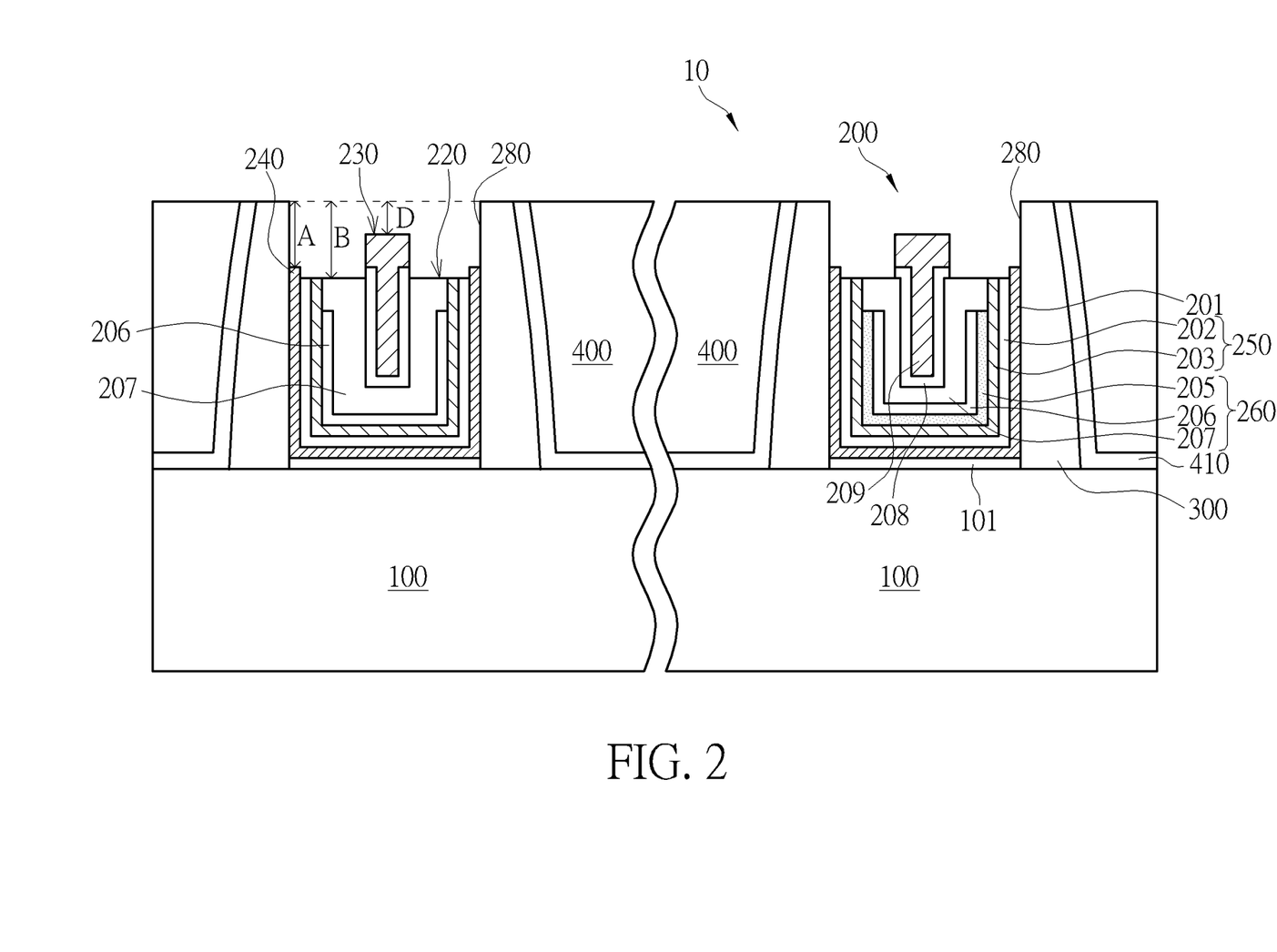

The semiconductor structure 10 may comprise a spacer 300 disposed between the gate structure 200 and the interlayer dielectric 400, and a contact etching stop layer (CESL) 410 disposed between the spacer 300 and the interlayer dielectric 400. After the gate process is finished, the top surfaces of the gate structure 200, the interlayer dielectric 400, and the spacer 300 and the CESL 410 between the gate structure 200 and the interlayer dielectric 400 are flush with each other. In other words, the semiconductor structure 10 has a flat top surface after the gate process. As shown in FIG. 2, a gate etching back step is performed to remove a portion of the gate electrode 210 and a portion of the gate dielectric layer 201, to form a recess 280. In the preferred embodiment, the LRM 209 in the middle portion of the gate electrode 210 has a slower etching rate than the other portion of the gate electrode 210, and consequently becomes a protruding portion 230 with a depth D after the etching back step. The other portion of the gate electrode 210 becomes a side portion 220 with a depth B. Preferably, the depth B is larger than the depth D. The gate dielectric layer 201 is etched to a depth A, and may have an extending portion 240 which protrudes from the sidewall of the gate electrode 210 and is between the insulating cap layer and the spacer. Preferably, the condition B>A>D is satisfied.

Figure 3:
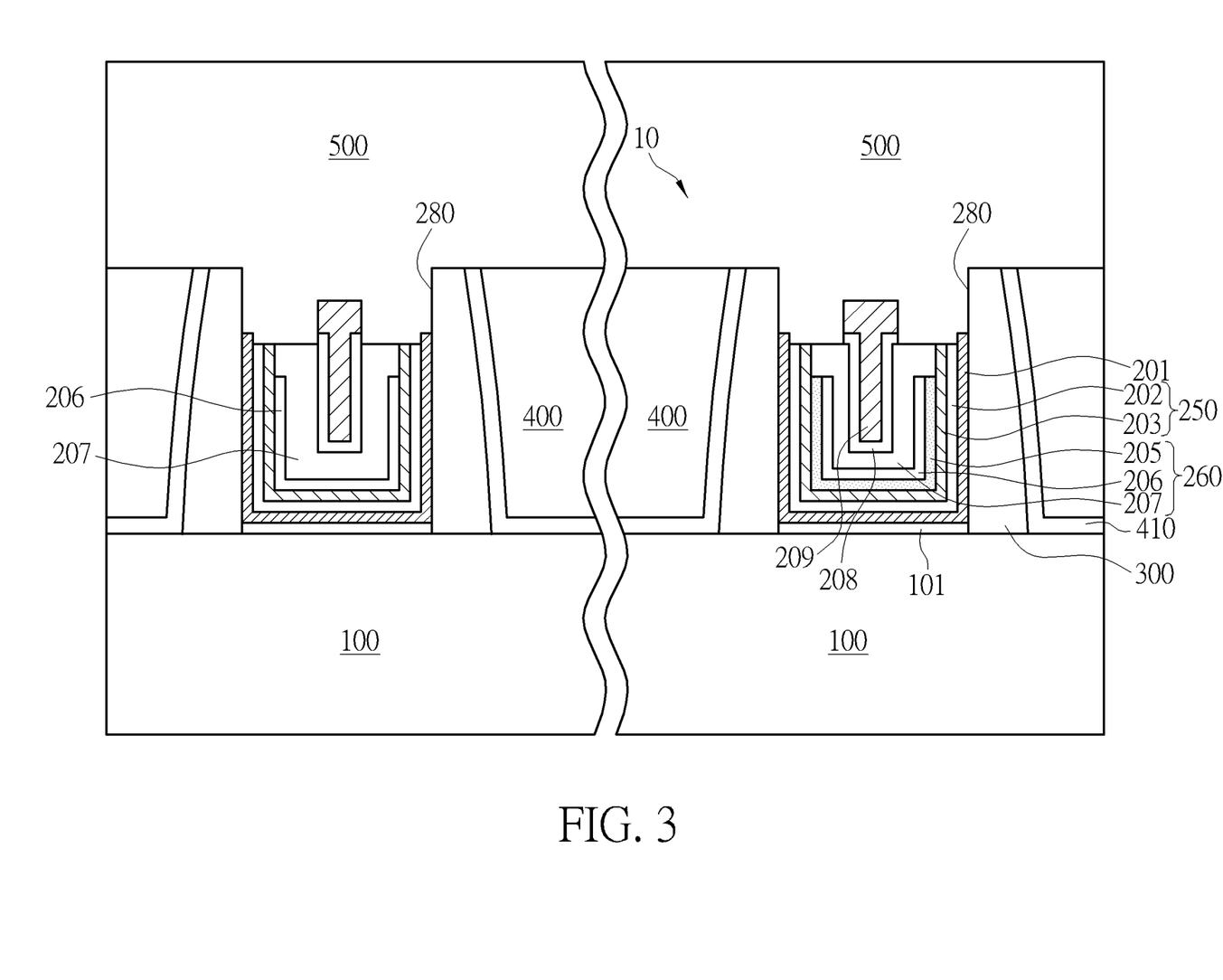

As shown in FIG. 3, an insulating material 500 is blankly deposited. The insulating material 500 may comprise silicon nitride (SiN) or other high-k material, but is not limited thereto. The insulating material 500 fills the recess 280 and covers the gate electrode 210 and the gate dielectric layer 201.

Figure 4:
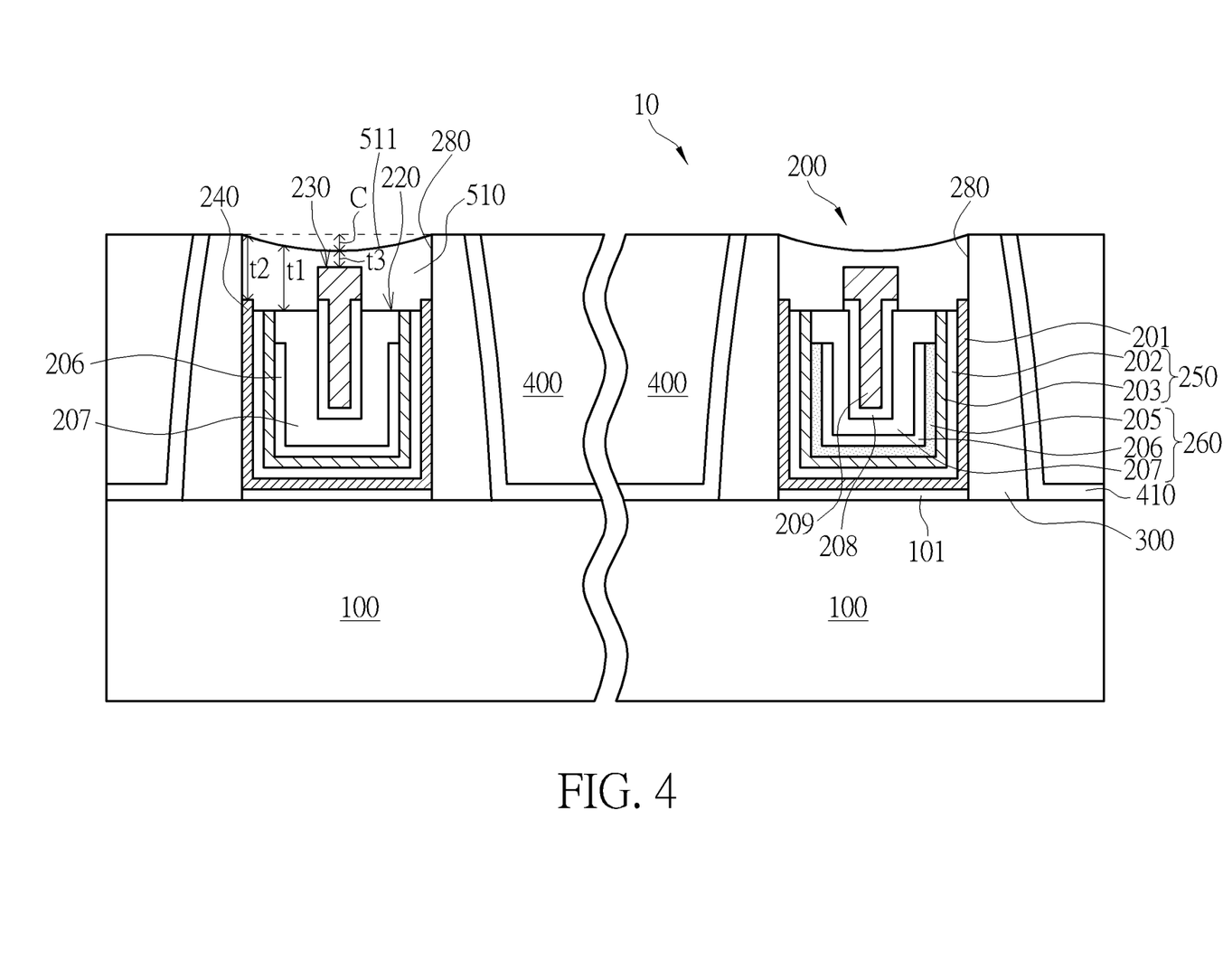

As shown in FIG. 4, a chemical mechanical polishing (CMP) process is performed to remove the insulating material 500 outside the recess 280. The insulating material 500 remaining within the recess 280 then becomes the insulating cap layer 510. The insulating cap layer 510 is directly atop the gate electrode, covering the side portion 220, and encompassing the top and the sidewall of the protruding portion 230. The insulating cap layer 510 also covers the extending portion 240 of the gate dielectric layer 201. It is noteworthy that, in the preferred embodiment, by optimizing the deposition condition of the insulating material 500 and the CMP process, the formed insulating cap layer 510 may have a concave top surface 511 with an inwardly recessed depth C.

The insulating cap layer 510 above the side portion 220 and the protruding portion 230 may have a thickness t1 and t3, respectively. The insulating cap layer 510 above the extending portion 240 of the gate dielectric layer 201 may have a thickness t2. Preferably, the condition t1>t2>t3 is satisfied. In a preferred embodiment, the relation between t1, t2 and t3 is around 5:4:1.

After the formation of the insulating cap layer 510, an interlayer dielectric 600 is deposited on the gate structure 200, the spacer 300, the insulating cap layer 510 and the interlayer dielectric 400. Subsequently, a photolithography and etching process (PEP) is carried out at least once to define the region where the contact plug would be formed. For instance, after the PEP process, an S/D contact hole is formed directly on the S/D region (not shown), and a gate contact hole is formed directly on the gate structure 200. Subsequently, the contact holes are filled with conductive material, and a planarization technique such as CMP or etching back process is carried out to remove the excess conductive material, thereby forming the S/D contact plug and the gate conduct plug which electrically connect to the S/D region and the gate of the semiconductor structure 10, respectively.

Figure 5:
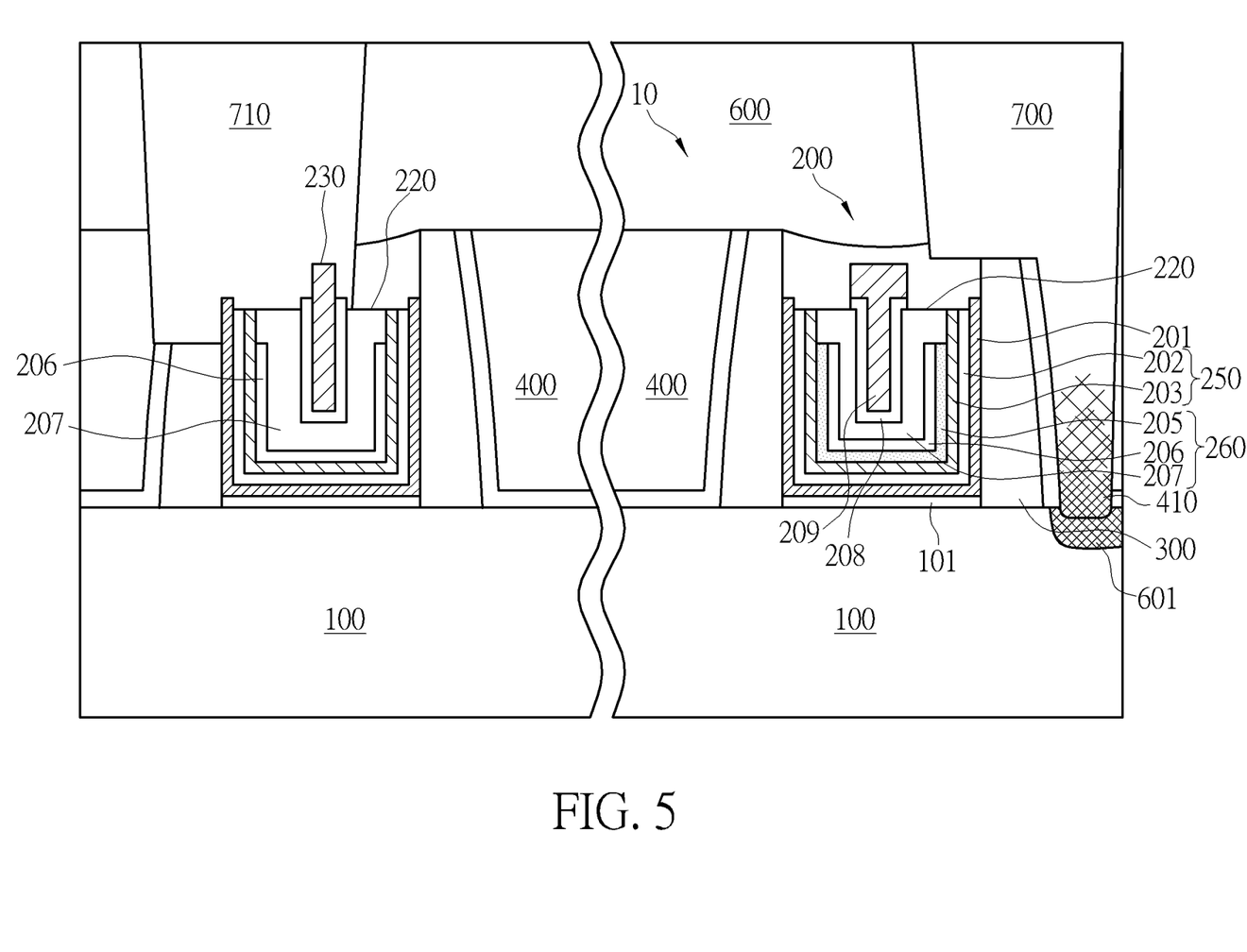
FIG. 5 is a schematic diagram showing misaligned contact plugs.

Process variations may cause misalignment of the contact plugs. FIG. 5 is a schematic diagram showing the misaligned contact plugs. After the insulating cap layer 510 is formed, as shown in FIG. 4, an interlayer dielectric 600 is deposited, and the contact plugs are formed by the above process.

The right side of FIG. 5 shows a misaligned S/D contact 700. After the photolithography step, a portion of the interlayer dielectric 600 directly above the gate electrode 210, specifically, above the side portion 220, will be exposed in the etching area. In the preferred embodiment, the thicker insulating cap layer 510 above the side portion 220 may act as the hard mask during the etching process, protecting the gate electrode 210 from being etched. This also provides electrical insulation between the gate electrode 210 and the S/D contact plug 700. The left side of FIG. 5 shows a misaligned gate contact plug 710. The thinner insulating cap layer 510 above the protruding portion 230 makes it easier to be etched through by the etching process. The protruding portion 230 can provide a larger landing area for the gate contact plug 710, and therefore may provide a lower contact resistivity. In the preferred embodiment, the insulating cap layer 510 with the concave top surface 511 is even thinner above the protruding portion 230, which is better for the gate contact etching process.

Figure 6:
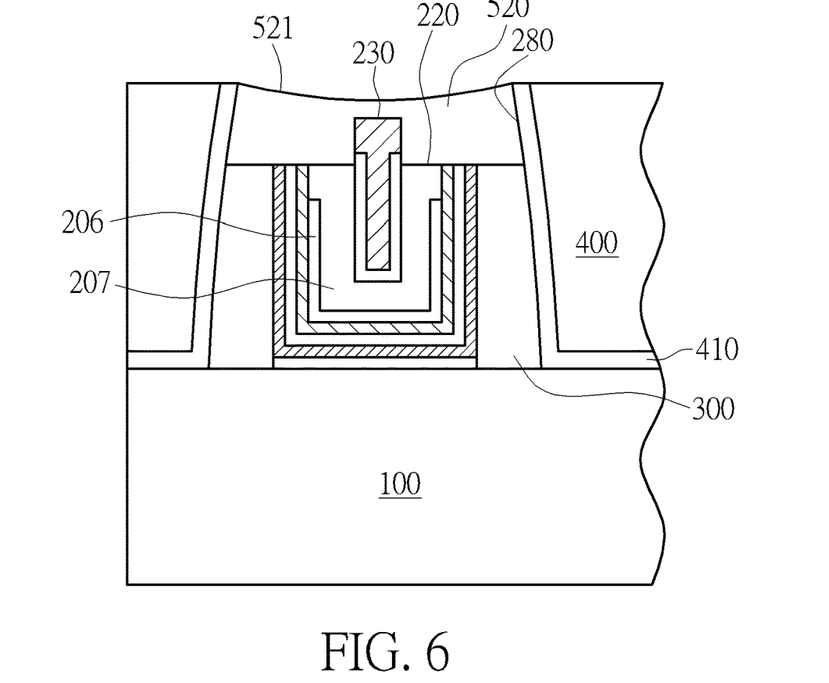
FIG. 6 is a schematic diagram showing another embodiment of the invention, wherein the insulating cap layer is atop the spacer.

FIG. 6 illustrates another embodiment of the invention. The difference between this embodiment and previous embodiments is that, after the gate etching back step shown in FIG. 2, another etching step is carried out to laterally remove a portion of the spacer 300. Therefore, the recess 280 extends laterally to the region above the spacer 300. The formed insulating cap layer 520 extends to the top of the spacer 300, and has a concave top surface 521.

Figure 7:
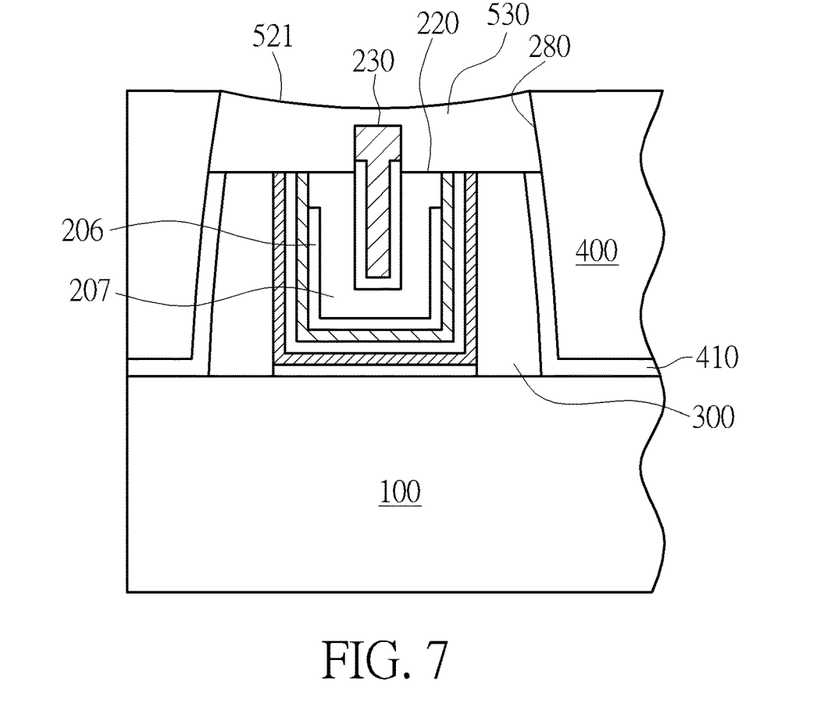
FIG. 7 is a schematic diagram showing another embodiment of the invention, wherein the insulating cap layer is atop the spacer and the contact etching stop layer.

FIG. 7 is another embodiment of the invention. Similarly, after the gate etching back step, more etching steps are carried out to laterally remove a portion of the spacer 300 and a portion of the contact etching stop layer (CESL) 410. Therefore, the recess 280 extends laterally to the region above the CESL 410. The formed insulating cap layer 530 extends to the top of the CESL 410, and has a concave top surface 531.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
   a substrate;
   an interlayer dielectric disposed on the substrate and having a gate structure therein, wherein the gate structure comprises:
   a gate electrode on the substrate, having a protruding portion and two side portions at two sides of the protruding portion, wherein the protruding portion protrudes between two top surfaces of the two side portions; and
   a gate dielectric layer disposed between the gate electrode and the substrate, wherein the gate electrode comprises a bottom barrier metal, a first work function metal on the bottom barrier metal, a second work function metal on the first work function metal, a third work function metal on the second work function metal, a top barrier metal disposed on the third work function metal and a low resistance metal filling a space in the middle of the gate electrode, wherein the first work function metal and the second work function metal respectively has a U shaped cross-section profile, the third work function metal has an inverted horse-shoe shape with lateral portions covering top surfaces of the first work function metal and the second work function metal;
   a pair of spacers disposed on two sides of the gate structure between the interlayer dielectric and the gate structure; and
   an insulating cap layer disposed between the pair of spacers, directly atop the gate electrode and completely covering a top surface and a sidewall of the protruding portion and the two top surfaces of the two side portions, wherein the insulating cap layer comprises silicon nitride or high-k dielectric material, wherein a top surface of the interlayer dielectric and top surfaces of the pair of spacers are not covered by the insulating cap layer, wherein the insulating cap layer has a concave top surface in its entirety extending between the pair of spacers, wherein a top edge of the concave top surface of the insulating cap layer is at a same level with the top surfaces of the pair of spacers, and an remaining portion of the concave top surface of the insulating cap layer is lower than the top surfaces of the pair of spacers.

2. The semiconductor structure according to claim 1, wherein the concave top surface of the insulating cap layer is inwardly recessed toward the protruding portion of the gate electrode.

3. The semiconductor structure according to claim 1, wherein the top surfaces of the two side portions are lower than the top surface and the sidewall of the protruding portion.

4. The semiconductor structure according to claim 3, wherein the insulating cap layer above the top surface of the protruding portion is thinner than the insulating cap layer above the top surfaces of the two side portions.

5. The semiconductor structure according to claim 1, further comprising a contact etching stop layer disposed between the pair of spacers and the interlayer dielectric.

6. The semiconductor structure according to claim 1, wherein the protruding portion comprises the low resistance metal.

7. The semiconductor structure according to claim 1, further comprising an interfacial layer between the substrate and the gate dielectric layer.

8. The semiconductor structure according to claim 1, wherein the gate dielectric layer is further disposed between the gate electrode and the spacer, and has a U shaped cross-section.

9. The semiconductor structure according to claim 8, wherein the gate dielectric layer has an extending portion protruding vertically from the top surfaces of the side portions of the gate electrode, wherein a top-surface of the extending portion of the gate dielectric layer is lower than the top surfaces of the pair of spacers, respectively.

10. The semiconductor structure according to claim 1, wherein the gate dielectric layer comprises high-k dielectric material.

* * * * *